United States Patent
Liao et al.

(10) Patent No.: US 6,932,622 B2
(45) Date of Patent: Aug. 23, 2005

(54) ELECTRICAL CONNECTOR

(75) Inventors: Fang-Jwu Liao, Tu-chen (TW); Wen-Chun Chen, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/914,804

(22) Filed: Aug. 9, 2004

(65) Prior Publication Data

US 2005/0032408 A1 Feb. 10, 2005

(30) Foreign Application Priority Data

Aug. 8, 2003  (TW) ...................................... 92214448 U

(51) Int. Cl.⁷ .............................................. H01R 12/00
(52) U.S. Cl. ........................................ 439/73; 439/331
(58) Field of Search .................................. 439/73, 331

(56) References Cited

U.S. PATENT DOCUMENTS

| | | | |
|---|---|---|---|
| 4,923,404 A | * | 5/1990 | Redmond et al. .............. 439/71 |
| 5,387,120 A | * | 2/1995 | Marks et al. ................ 439/331 |
| 5,791,486 A | * | 8/1998 | Brahmbhatt ................ 439/331 |

* cited by examiner

Primary Examiner—Tho D. Ta
(74) Attorney, Agent, or Firm—Wei Te Chung

(57) ABSTRACT

A land grid array connector (1) for electrically connecting a CPU package (3) to a printed circuit board includes a housing (2) and a number of contacts received in passageways (284) of the housing. The housing has a bottom wall (28) and sidewalls (22,24,26). The bottom wall and the sidewalls cooperatively define a receiving space (20) for accommodating the package therein. Protrusion member (228) is formed on the sidewalls and extends inwardly into the receiving space. A through hole (280) below the protrusion member is defined in the bottom wall for facilitating molding the protrusion member. The protrusion member is configured with a vertical abutting surface (2280) formed at a lateral end toward the receiving space thereof. The bottom wall forms a mounting surface (2820) for sustaining the CPU chip thereon. A vertical shortest distance is formed between a lowest end of the abutting surface of the protrusion member and the mounting surface of the bottom wall. This configuration can protect the sidewalls of the housing from being scraped during insertion of the package into the housing. Reliable electrical connection between the package and contacts of the land grid array connector is secured.

11 Claims, 4 Drawing Sheets

US 6,932,622 B2

ELECTRICAL CONNECTOR

BACKGROUND OF THE INVENTION

1. Field of the Invention

The present invention relates to electrical connectors, and more particularly to a land grid array (LGA) connector for electrically connecting an electronic package such as a CPU chip, to a circuit substrate such as a printed circuit board (PCB).

2. Description of the Prior Art

LGA connectors are commonly used in personal computer (PC) systems, for electrically connecting CPU chips to PCBs. This kind of connectors can avoid soldering procedures during being mounted on the PCBs.

FIG. 4 shows such a conventional LGA connector. The LGA connector comprises an insulative housing 2' receiving a plurality of contacts (not shown) therein, a stiffener 4' attached to the housing 2', a load plate 5' and a lever 6' pivotally mounted to opposite sides of the housing 2' respectively. The housing 2' comprises a floor 20', two opposite first sidewalls 24' and two opposite second sidewalls 26' adjacent the first sidewalls 24'. A plurality of passageways 22' is defined in the floor 20', for receiving the contacts therein. The contacts each protrude outwardly from a top portion of the housing 2', for connecting with corresponding contact pads (not shown) of a CPU chip 3'. The first sidewalls 24' each define a plurality of alternate protrusions 240' and grooves 242'. Bosses 262', 264' are respectively formed on the second sidewalls 26', for positioning and keying the CPU chip 3' in the housing 2'. Notches 32', 34' are defined in the CPU chip 3', for interferingly engaging with the bosses 265', 266' of the housing 2'. The CPU chip 3' is, thereby, retained in the housing 2'. A step 263' is formed at place the floor 20' connecting with the second sidewalls 26', for supporting two opposite sides of the CPU chip 3' thereon.

In use, the CPU chip 3' is disposed on the housing 2'. The load plate 5' is pressed down onto the CPU chip 3', pressing portions (not numbered) of the load plate 5' resting on the CPU chip 3'. The lever 6' is rotated down to engage with one side of the load plate 5', urging the pressing portion of the load plate 5' to press on the CPU chip 3'.

When the lever 6' presses down on the load plate 5', the pressing portions of the load plate 5' push down on the CPU chip 3'. Because the load plate 5' urges against one side of the CPU chip 3' near the load plate 5' engaging with the stiffener 4', the opposite side of the CPU chip 3' is liable to be bent upwardly. As a result, warp or even horizontal displacement of the CPU chip 3' occurs as the opposite side being pressed down finally. During insertion of the CPU chip 3' into the housing 2', the opposite side of the CPU chip is prone to scrape a corresponding second sidewall 26' of the housing 2'. This can bring damage to effective electrical connection between the CPU chip 3' and the contacts.

Referring also to FIGS. 5 and 6, the CPU chip 3' is slantwise positioned in the housing 2', one side of the CPU chip 3' resting on the step 263' and sharp-angle 362 of the opposite side abutting against a correspond second sidewall 26'. When the lever 6' is rotated down to press on the load plate 5', the pressing portion of the load plate 5' pushing down on the CPU chip 3'. Then the CPU chip 3' moves downwardly under the pressing force of the load plate 5' applied by the lever 6', sides of the CPU chip 3' near the second sidewalls 26 abutting against and urging inner surfaces of the corresponding second sidewalls 26. Accordingly, scraping of the inner surfaces of the second sidewalls 26' happens. Similarly, said scraping happens on inner surfaces of the first sidewalls 24' and the CPU chip 3' per se. As a result, parts of the inner surfaces of the sidewalls 24', 26' and the CPU chip 3' scraped-away particulates are scraped away. The scraped-away particulates are prone to drop on the floor 20' of the housing 2', blocking up the CPU chip 3' upwardly. This adversely can effect the firm connection between the CPU chip 3' and the contacts near the scraped-away particulates. As a result, reliability of the electrical connection between the CPU chip 3' and the contacts of the housing 2' is accordingly decreased.

Therefore, a new land grid array electrical connector which overcomes the above-mentioned disadvantages of the prior art is desired.

SUMMARY OF THE INVENTION

Accordingly, one object of the present invention is to provide a new LGA connector, whereby the connector can avoid scraping damage to a housing of the connector during insertion of a CPU chip into the housing.

To achieve the aforementioned object, an LGA connector 1 in accordance with a preferred embodiment of the present invention is provided. The LGA connector comprises an insulative housing, a plurality of contacts received in the housing, a load plate and a lever mounted to opposite sides of the housing respectively. The housing has a bottom wall, a plurality of sidewalls extending upwardly from the bottom wall and a receiving space defined between the bottom wall and the sidewalls, for accommodating a CPU chip therein. A mounting surface is formed on the bottom wall, for sustaining the CPU chip thereon. At least one protrusion member is formed on the sidewalls. Said protrusion member protrudes inwardly into the receiving space, for avoiding scraping damage of sidewalls of the housing during insertion the CPU chip into the housing. The protrusion member is configured with an abutting surface toward the receiving space at a lateral end thereof. A vertical shortest distance is defined between a lowest end of the abutting surface of the protrusion member and the mounting surface of the bottom wall. When the CPU chip is slant disposed in the housing and warps upwardly, a sharp-angle corner of the CPU chip is still under the abutting surface. This can avoid the sharp-angle corner scrape the abutting surface of protrusion member during pressing and insertion the CPU chip into the housing. As a result, the sidewalls of the housing can be protected from being scraped during insertion of the CPU chip into the housing.

Other objects, advantages and novel features of the present invention will become more apparent from the following detailed description when taken in conjunction with the accompanying drawings, in which:

DETAILED DESCRIPTION OF THE PREFERRED EMBODIMENT OF THE INVENTION

Reference will now be made to the drawings to describe the present invention in detail.

Figure 1:
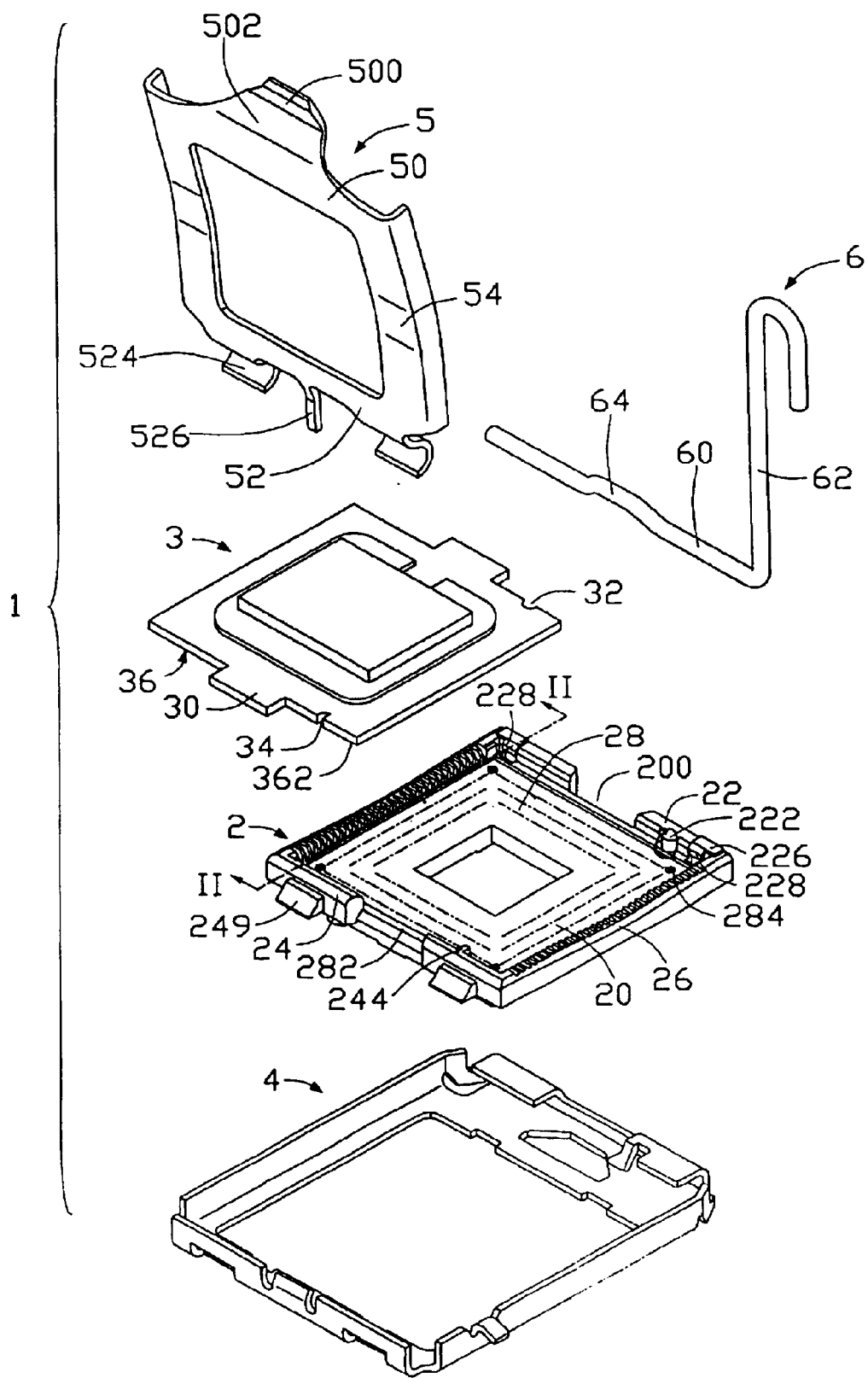
FIG. 1 is an exploded, isometric view of an LGA connector in accordance with a preferred embodiment of the present invention.
Figure 2:
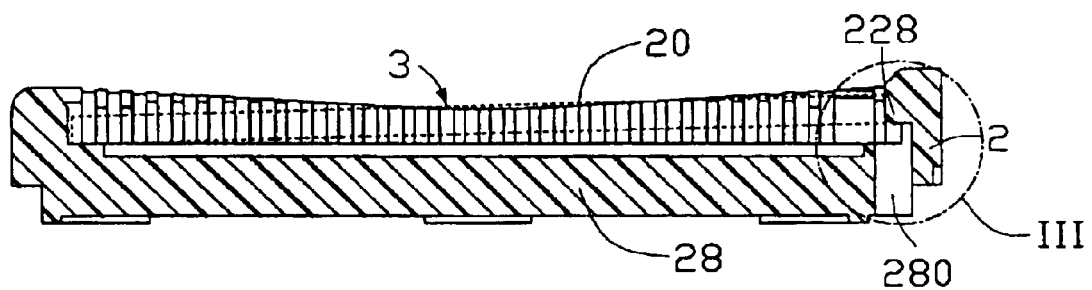
FIG. 2 is a cross-sectional view taken along a line II—II of FIG. 1, showing the CPU chip being slantwise inserted into the housing.
Figure 3:
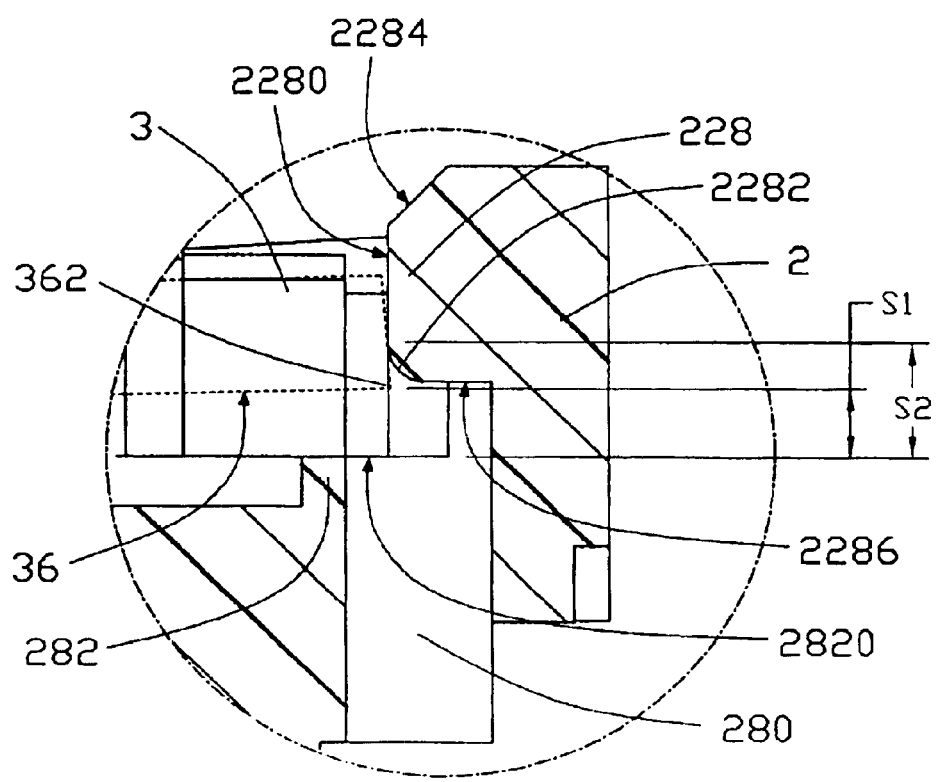
FIG. 3 is an enlarged view of a circled portion III of FIG. 2.
Figure 4:
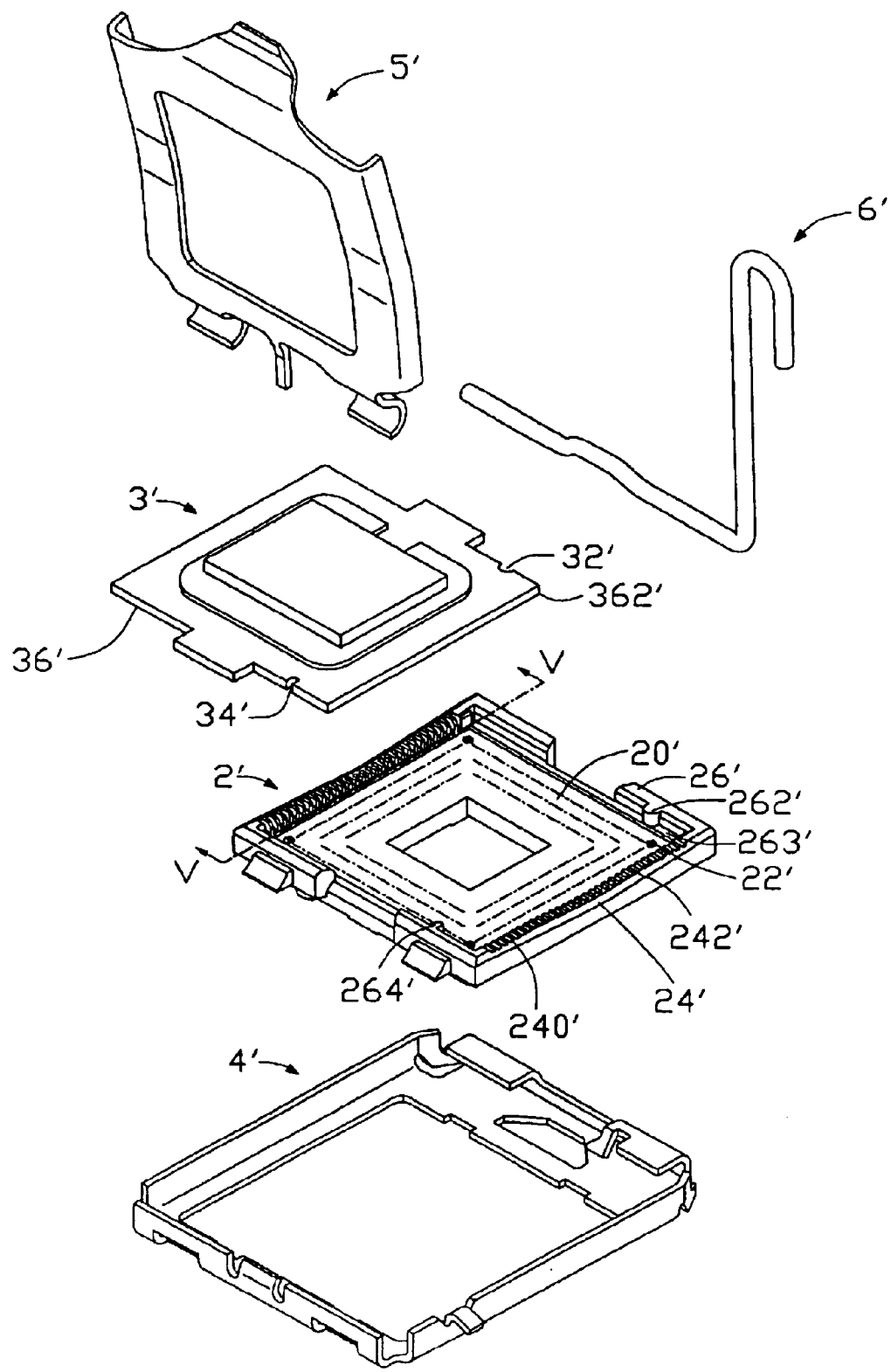
FIG. 4 is an exploded, isometric view of a conventional land grid array connector.
Figure 5:
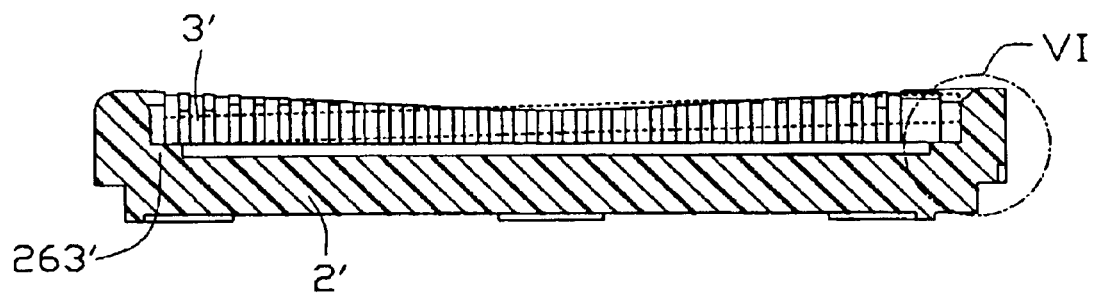
FIG. 5 is a cross-sectional view taken along a line V—V of FIG. 4, showing a CPU chip being slantwise inserted into the LGA connector.
Figure 6:
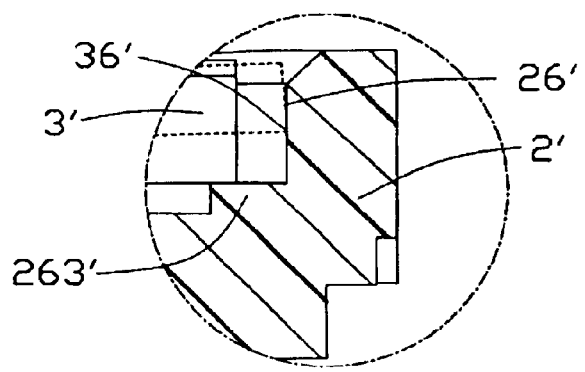
FIG. 6 is an enlarged view of a circled portion VI of FIG. 5.

Referring to FIGS. 1 to 3, an LGA connector 1 in accordance with a preferred embodiment of the present invention is provided for electrically connecting a CPU chip 3 to a PCB (not shown). The LGA connector comprises a rectangular insulative housing 2, a plurality of contacts (not showed) received in the housing 2, a stiffener 4 attached to the housing 2 for reinforcing the housing 2, a load plate 5 and a lever 6 pivotably mounted to opposite sides of the stiffener 4 respectively.

The housing 2 is configured with a bottom wall 28, a first sidewall 22 extending upwardly from a side of the bottom wall 28, a second sidewall 24 extending upwardly from an opposite side of the bottom wall 28, and two opposite third sidewalls 26 interconnecting the first and second sidewalls 22,24. A receiving space 20 is defined cooperatively by the bottom wall 28 and the sidewalls 22,24,26, for accommodating the CPU chip 3 therein.

A plurality of passageways 284 is defined in the bottom wall 28, for receiving the contacts therein. A step 282 is formed on two sides of the bottom wall 28 adjacent the first and second sidewalls 22,24, respectively. The step 282 has a mounting surface 2820, for sustaining two opposite ends of the CPU chip 3 thereon. This can avoid the CPU chip 3 totally presses on the contacts, and thereby reducing pressure the CPU chip 3 acting on the contacts when the CPU chip 3 is pressed and retained in the receiving space 20. Thus the contacts are protected from being damaged by excessive pressure caused by the CPU chip 3.

A cutout 200 is defined in a middle portion of the first and second sidewalls 22,24, respectively. The cutout 200 communicates with the receiving space 20, for engagingly receiving the CPU chip 3. This also can facilitate placement the CPU chip 3 into the housing 2 and extraction of the CPU chip 3 thererfrom. First and second bosses 222,244 are formed inwardly toward the receiving space 20 on inner sides of the first and second sidewalls 22,24 near one end thereof, respectively. The first and second bosses 222,244 depend at bottom thereof on the step 282, for fixing the CPU chip 3 in the receiving space of the housing 2.

A raised portion 226 projects upwardly from two ends of the first sidewall 22 near the third sidewalls 26, respectively. A protrusion member 228 protrudes inwardly from the first sidewall 22 into the receiving space 20, connecting with the raised portion 226. The protrusion member 228 comprises a vertical abutting surface 2280 toward the receiving space 20 at a free lateral end thereof, a horizontal bottom surface 2826 formed at a lower end thereof near the bottom wall 28 and an arc chamfer 2822 interconnecting with the lateral surface 2280 and the bottom surface 2286. The abutting surface 2280 of the protrusion member 228 abuts against on a lateral side of the CPU chip 3 during the CPU chip 3 being disposed into the housing 2.

A vertical shortest distance S2 is formed between a lowest end of the abutting surface 2280 of protrusion member 228 and the mounting surface 2820 of the bottom wall 28. A slant guiding surface 2286 is formed at an opposite upper end of the protrusion member 228, for facilitating insertion the CPU 3 into the housing 2. A through hole 280 under the protrusion member 228 is defined in the bottom wall 28. The through hole 282 has a slightly larger transverse dimension than the protrusion member 228, for facilitating the molding of the protrusion member 228. A pair of locking blocks 249 protrudes from an outside of the second sidewall 26, for abutting against and fastening the load plate 5 attached thereon.

The CPU chip 3 has a generally rectangular configuration. The CPU chip 3 comprises a bottom face 36 with sharp-angled corner 362. A pair of rectangular lips 30 respectively extends from two opposite lateral sides of the CPU chip 3. The lips 30 engage with the corresponding cutouts 200 of the housing 2, for facilitating assembling the CPU chip 3 into the housing 2 and disassembling the CPU chip 3 from the housing 2. First and second notches 32, 33 are respectively defined in the opposite lateral sides of the CPU chip 3, for correspondingly engaging with the first and second bosses 222,244 of the housing 2. In assembly, the CPU chip 3 is pressed down and retained into the housing 2 in a predetermined direction with the fixing of the bosses 222,244. Two opposite ends of the CPU chip 3 are sustained on the step 282, and the lateral side abuts against the abutting surface 2280 of the protrusion member 228.

The load plate 5 is generally a rectangular frame. The load plate 5 has a first and second lateral sides 50,52, and two opposite sides (not numbered) connecting the first and second lateral sides 50,52. An engaging portion 500 is arcuately extended from a middle portion of the first lateral side 50. The engaging portion 500 forms an engaging surface 502 thereon. A pair of spaced clasps 524 symmetrically extends from the second lateral side 52. The clasps 524 each have a semicircular cross section, rotatablely mounted to the stiffener 4. A fastening leg 526 is formed between the clasps 524, for fixing the load plate 5 on the stiffener 4. The locking blocks 249 of the housing 2 abut against inner surface of the clasps 524, for fastening the load plate 5 on the housing 2. Pressing portions 54 are respectively protrude from a middle portion of the opposite sides to the direction of the receiving space 20 of the housing 2.

The lever 6 is substantially a crank. The lever 6 has a locating portion 60, an operation handle 62, and an offset cam portion 64. The locating portion 60 is pivotably mounted on one side of the load plate 5. The operation handle 62 extends perpendicularly from an end of the locating portion 60. The cam portion 64 is parallel to the locating portion 60 and formed at a middle portion thereof. The operation handle 62 is driven to move the connector between an open position and a closed position.

In insertion, once the CPU chip 3 is positioned on the housing 2, the lever 6 is rotated down from a vertical position to a horizontal position. The cam portion 64 of the lever 6 urges the engaging portion 500 of the load plate 5. Then the load plate 5 presses onto the CPU chip 3. And the pressing portions 54 of the load plate 5 push the CPU chip 3 downwardly. Thereby the CPU chip 3 is pressed slowly down into the receiving space 20 of the housing 2. When the CPU chip 3 is slant positioned in the housing 2 (as refers to FIG. 2 and FIG. 3), or warp of the CPU chip 3 occur because the load plate 5 firstly presses the side of the CPU chip 3 near the pressing portion 504.

A vertical distance S1 is formed between the sharp-angled corner 362 of the bottom face 36 and the mounting surface 2280 of the housing 2. The distance S1 is smaller than the shortest distance S1 between the abutting surface 2280 of the protrusion member 228 and the mounting surface 2820 of the bottom wall 28. That is, the sharp-angled corner 362 of the CPU chip 3 is under the abutting surface 2280. Thus, when the CPU chip 3 is pressed down in to the housing 2, the bottom wall 36 is supported on the step 282. The sharp-angled corner 362 moves downwardly, not interacting with the first sidewall 22 of the housing 2 near the lateral side of the CPU chip 3. This can protect the first sidewall 22 of the housing 2 against the CPU chip 3 from scraping damage caused by the slant and the warp of the CPU chip 3. As a result, reliable electrical connection between the CPU chip 3 and the contacts of the housing 2 is secured.

While the present invention has been described with reference to a preferred embodiment, the description is illustrative and is not to be construed as limiting the invention. Therefore, various equivalent modifications and changes known to persons skilled in the art according to the spirit of the present invention are considered within the scope of the present invention as defined in the appended claims.

What is claimed is:

1. An electrical connector comprising:
   an insulative housing having a bottom wall, a plurality of sidewalls extending upwardly from the bottom wall and a receiving space cooperatively defined by the bottom wall and the sidewalls for accommodating an electrical package therein;
   a plurality of contacts received in the housing; and
   at least one protrusion member formed on the sidewalls of the housing, said protrusion member protruding facing toward the receiving space, to engagingly guide insertion of a lateral side of the package into the receiving space when the opposite lateral side of the package is received in the receiving space and protect the sidewalls of the housing from being scraped during the inserting of the package into the housing;
   wherein a through hole under the protrusion member is defined in the bottom wall of the housing, the through hole having a slightly larger transverse dimension than the protrusion member for facilitating the molding of the protrusion member; and
   wherein the protrusion member forms an abutting surface toward the receiving space at a free lateral end thereof, the vertical surface abutting against the lateral side of the package during insertion the package into the housing.

2. The electrical connector as claimed in claim 1, wherein the protrusion member is configured with chamfer at a lower end thereof near the bottom wall, the chamfer connecting with a lowest end of the abutting surface.

3. The electrical connector as claimed in claim 2, wherein the protrusion member forms a slant guiding surface at an upper end thereof opposite the chamfer for facilitating insertion the package into the housing.

4. The electrical connector as claimed in claim 3, wherein the sidewalls of the housing comprise a first sidewall and a second sidewall opposite the first sidewall, the protrusion member being formed on the first sidewall.

5. The electrical connector as claimed in claim 4, wherein the protrusion member is formed on two ends of the first sidewall.

6. The electrical connector as claimed in claim 5, wherein a step is formed on two opposite ends of the bottom wall adjacent the first and second sidewalls respectively, the step having a mounting surface for supporting the package thereon.

7. The electrical connector as claimed in claim 6, wherein a vertical shortest distance is formed between the mounting surface of the bottom wall and the lowest end of the vertical surface of the protrusion member.

8. The electrical connector as claimed in claim 7, wherein first and second bosses are formed inwardly on the first and second sidewalls respectively for engagingly fixing the package in the receiving space.

9. An electrical connector for connecting an electronic package comprising:
   an insulative housing having a bottom wall and sidewalls extending upwardly from the bottom wall, the bottom wall and the sidewalls cooperatively defining a space for receiving the package therein, the bottom wall defining a plurality of passageways therein;
   a plurality of contacts received in the passageways of the housing; and
   an abutting surface being formed on one of the sidewall, for protecting said sidewall from being damaged during slantwise inserting the package into the housing, a mounting surface being formed on the bottom wall for supporting the package thereon, the abutting surface being totally above the mounting surface of the bottom wall and capable of abutting against on a lateral side of the package;
   wherein said sidewall with abutting surface forms a protrusion member protruding inwardly toward the receiving space, the abutting surface being located at a free lateral end of said sidewall and toward the receiving space;
   wherein the protrusion member comprises an arc chamfer at a lower end near the bottom wall, the chamfer connecting with the abutting surface at one end thereof;
   an oblique guiding surface is formed at an upper end far from the bottom wall of the protrusion member for easing insertion the package in the housing; and
   wherein a through hole below the protrusion member is defined in the bottom wall, the through hole having a little larger radial dimension than the protrusion member for facilitating the molding of the protrusion member.

10. The electrical connector as claimed in claim 9, wherein the sidewall of the housing comprises opposite first and second sidewalls and two opposite third sidewalls interconnecting the first and second sidewalls, the protrusion member being formed on two ends of the first sidewall adjacent the third sidewalls, respectively.

11. The electrical connector as claimed in claim 10, wherein the first and second sidewalls form inwardly first and second bosses toward the receiving space thereon, respectively, the first and second bosses engaging with the package for fastening the package in the receiving space.

* * * * *